United States Patent
Jang

(10) Patent No.: US 7,593,087 B2
(45) Date of Patent: Sep. 22, 2009

(54) LIQUID CRYSTAL DISPLAY DEVICE AND PORTABLE DISPLAY APPARATUS USING THE SAME

(75) Inventor: Jin-seok Jang, Suwon-si (KR)

(73) Assignee: Samsung Mobile Display Co., Ltd., Suwon-si, Gyeonggi-do (KR)

(*) Notice: Subject to any disclaimer, the term of this patent is extended or adjusted under 35 U.S.C. 154(b) by 209 days.

(21) Appl. No.: 11/723,278

(22) Filed: Mar. 19, 2007

(65) Prior Publication Data

US 2008/0076273 A1    Mar. 27, 2008

(30) Foreign Application Priority Data

Sep. 22, 2006   (KR) .................. 10-2006-0092495

(51) Int. Cl.
*G02F 1/1345* (2006.01)
(52) U.S. Cl. .................... 349/150; 349/149
(58) Field of Classification Search ............. 349/150
See application file for complete search history.

(56) References Cited

U.S. PATENT DOCUMENTS

| | | | |
|---|---|---|---|
| 6,433,414 B2 | 8/2002 | Saito | |
| 6,897,912 B2* | 5/2005 | Kawakami et al. | 349/61 |
| 2005/0179850 A1 | 8/2005 | Du | |
| 2006/0250563 A1* | 11/2006 | Nishita | 349/150 |

FOREIGN PATENT DOCUMENTS

| | | |
|---|---|---|
| JP | 2000-075316 | 3/2000 |
| JP | 2003-092020 | 3/2003 |
| KR | 10-2000-0001174 A | 1/2000 |
| KR | 10-2001-0078040 A | 8/2001 |
| KR | 10-2005-0064550 | 6/2005 |
| KR | 10-2006-0000712 A | 1/2006 |
| KR | 10-2006-0057951 | 5/2006 |

\* cited by examiner

*Primary Examiner*—Richard H Kim
(74) *Attorney, Agent, or Firm*—Lee & Morse, P.C.

(57) ABSTRACT

A liquid crystal display device having a flexible printed circuit board to provide electrical signals from a driver printed circuit board to a liquid crystal display panel and a backlight unit, the flexible printed circuit board including a first substrate portion connected to a pad portion of the liquid crystal display panel, a second substrate portion connected to the first substrate portion and including a light source, a third substrate portion positioned between the backlight unit and the driver printed circuit board and connected to the driver printed circuit board, and at least one connection substrate portion connecting the second substrate portion to the third substrate portion, wherein the first, second, third and connection substrate portions are integrated.

18 Claims, 7 Drawing Sheets

LIQUID CRYSTAL DISPLAY DEVICE AND PORTABLE DISPLAY APPARATUS USING THE SAME

BACKGROUND OF THE INVENTION

1. Field of the Invention

The present invention relates to a liquid crystal display device. More particularly, the present invention relates to a liquid crystal display device that transmits electrical signals to a liquid display panel having an integrated flexible printed circuit board with a light source for a backlight unit.

2. Description of the Related Art

A flexible printed circuit board (FPCB) may include a conductive thin film layer, e.g., copper, on the base film of an insulated resin material. The conductive layer may be formed in a desired pattern and coated with a protective film, so that the resulting printed circuit board may be thin and flexible.

In many types of display devices, e.g., a liquid crystal display (LCD) device, flexible printed circuit boards may be used for connecting the driver printed circuit to a display panel. One of the flexible printed circuit boards may also include an integral light source for a backlight unit.

In the conventional art, two separate flexible printed circuit boards may be used for each LCD panel. One flexible printed circuit may attach to the driver printed circuit, and another may attach to the light source. An attempt was made to manufacture a single flexible printed circuit board that could serve both roles simultaneously. However, it was discovered that a square flexible printed circuit board was deformed by the heat of manufacturing. The result was that the light source attached to the flexible printed circuit became misaligned, and thus could not be properly used as a backlight.

SUMMARY OF THE INVENTION

The present invention is therefore directed to a liquid crystal display device and portable display apparatus, which substantially overcome one or more of the problems due to limitations and disadvantages of the related art.

It is therefore a feature of the present invention to provide a liquid crystal display device that includes a single flexible printed circuit board to both apply electrical signals to a liquid crystal display panel and supply power to an integral light source.

It is therefore a feature of the present invention to provide a liquid crystal display device that includes a single flexible printed circuit board having an integral light source that retains proper alignment and orientation throughout the manufacturing process.

At least one of the above features and advantages of the present invention may be realized by providing a liquid crystal display device having a flexible printed circuit board to provide electrical signals from a driver printed circuit board to a liquid crystal display panel and a backlight unit, the flexible printed circuit board including a first substrate portion connected to a pad portion of the liquid crystal display panel, a second substrate portion connected to the first substrate portion and including a light source, a third substrate portion positioned between the backlight unit and the driver printed circuit board and connected to the driver printed circuit board; and at least one connection substrate portion connecting the second substrate portion to the third substrate portion, wherein the first, second, third and connection substrate portions are integrated.

The backlight unit may include a light guide plate positioned on one side of the light source and receiving light from the light source, and a mold frame including a mounting groove, wherein the light source may be positioned within the mounting groove in the mold frame. The liquid crystal display device may include at least two light sources on the flexible printed circuit board. The light source may be a light emitting diode. The second substrate portion may further include a boosting circuit for boosting voltage from the printed circuit board to the display panel. The first substrate portion may be thinner than the second substrate portion. The first substrate portion may include a single layer of conductive wiring, and the second substrate portion may include two or more layers of conductive wiring.

The connection substrate portion may be connected to a first end of the third substrate portion and a corresponding first end of the second substrate portion. The connection substrate portion may include a first connection substrate portion connecting a first end of the second substrate portion to a first end of the third substrate portion, and a second connection substrate portion connecting a second end of the second substrate portion to a second end of the third substrate portion. The connection substrate portion may be thinner than the third substrate portion. The connection substrate portion may include a single layer of conductive wiring, and the third substrate portion may include two or more layers of conductive wiring.

The second substrate portion may be layered between the first substrate portion and the third substrate portion. The light source may be between the second substrate portion and the third substrate portion. The light source may be between the driver printed circuit board and the second substrate portion. Two or more light sources may be between the driver printed circuit board and the second substrate portion. A boosting circuit for boosting voltage from the driver printed circuit board to the display panel may be between the driver printed circuit board and the second substrate portion.

The backlight unit may be layered between the driver printed circuit board and the second substrate portion. The liquid crystal display panel and driver printed circuit board may be layered with one atop the other and connected by the flexible printed circuit board. The driver printed circuit board may be attached to the third substrate of the flexible printed circuit board by a heat-oriented process. The second substrate may be isolated from the heat-oriented process.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
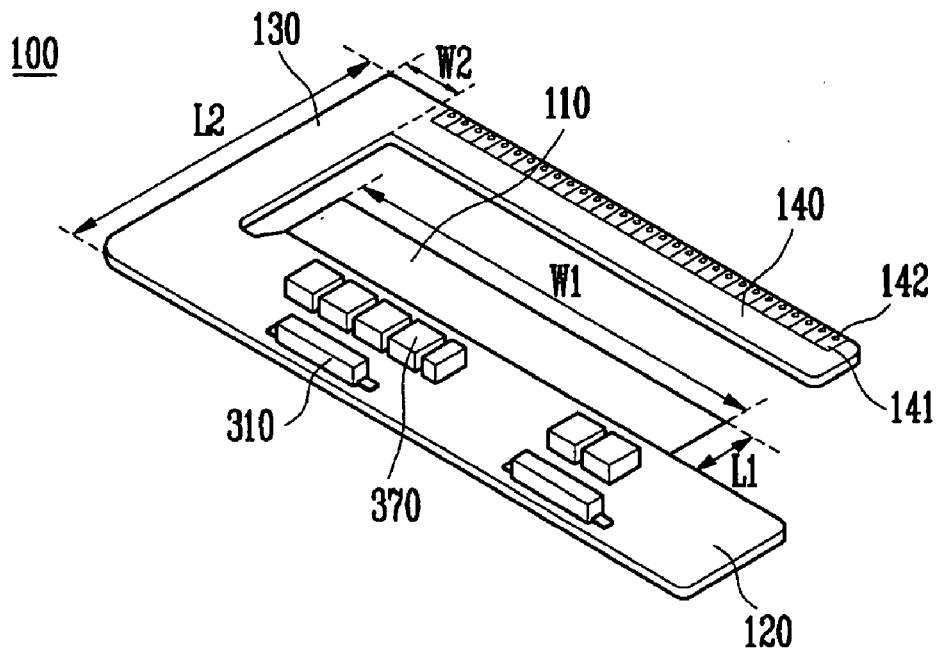
FIG. 1A illustrates a perspective view of a flexible printed circuit board according to an embodiment of the present invention.

Korean Patent Application Nos. 10-2006-0092495, filed on Sep. 22, 2006, in the Korean Intellectual Property Office, and entitled: "Liquid Crystal Display Device and Portable Display Apparatus Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
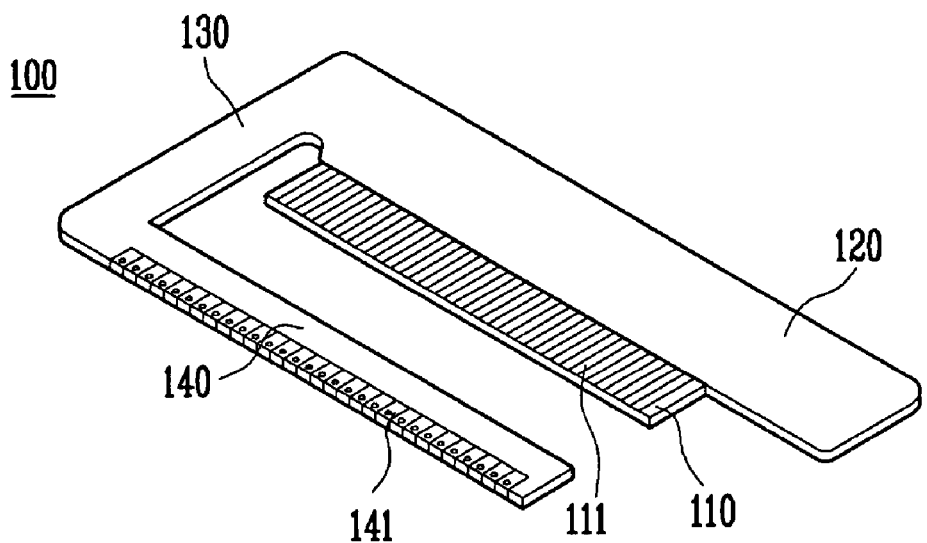
FIG. 1B illustrates a bottom perspective view of the embodiment as shown in FIG. 1A.

FIG. 1A illustrates a perspective view of a flexible printed circuit board 100 according to an embodiment of the present invention, and FIG. 1B illustrates a bottom perspective view of the embodiment as shown in FIG. 1A. A flexible printed circuit board 100 may include a first substrate portion 110, a second substrate portion 120, a connection substrate portion 130 and a third substrate portion 140, which may be integrally connected.

The first substrate portion 110 may include one or more terminals 111 for connection to another device. The terminal 111 may be formed by exposing an internal layer of conductive wiring inside the flexible printed circuit board 100.

The first substrate portion 110 may be connected to one part of the second substrate portion 120 in a location where there is only one layer of conductors inside the substrate. This may enable the first substrate 110 and second substrate 120 to be bent in relation to each other. The first substrate 110 may be formed to be thinner than the second substrate portion 120 and the third substrate portion 140.

The first substrate portion 110 may also be connected to the connection substrate portion 130. In FIGS. 1A-1B, the first substrate portion 110 may be connected to the middle of the second substrate portion 120, and the connection substrate portion 130 may be connected to the an end of the second substrate portion 120. The first substrate 110 and the connection substrate portion 130 may be oriented in the same direction while connected to the second substrate portion 120. The width W1 of the first substrate portion 110 may be wider than the width W2 of the connection substrate portion 130. The length L1 of the first substrate portion 110 may be shorter than the length L2 of the connection substrate portion 130.

Various components may be mounted on the second substrate portion 120, e.g., driving circuits, a light source such as a light emitting diode, a boosting circuit 370, etc.

The connection substrate portion 130 may connect the second substrate portion 120 to the third substrate portion 140. The conductive wiring layer inside the substrate portions 110 and 130 may be formed in a single layer to facilitate bending. In one embodiment, the first substrate 110, which may be bent, may be thinner than the second substrate portion 120 and the third substrate portion 140.

Figure 1C:
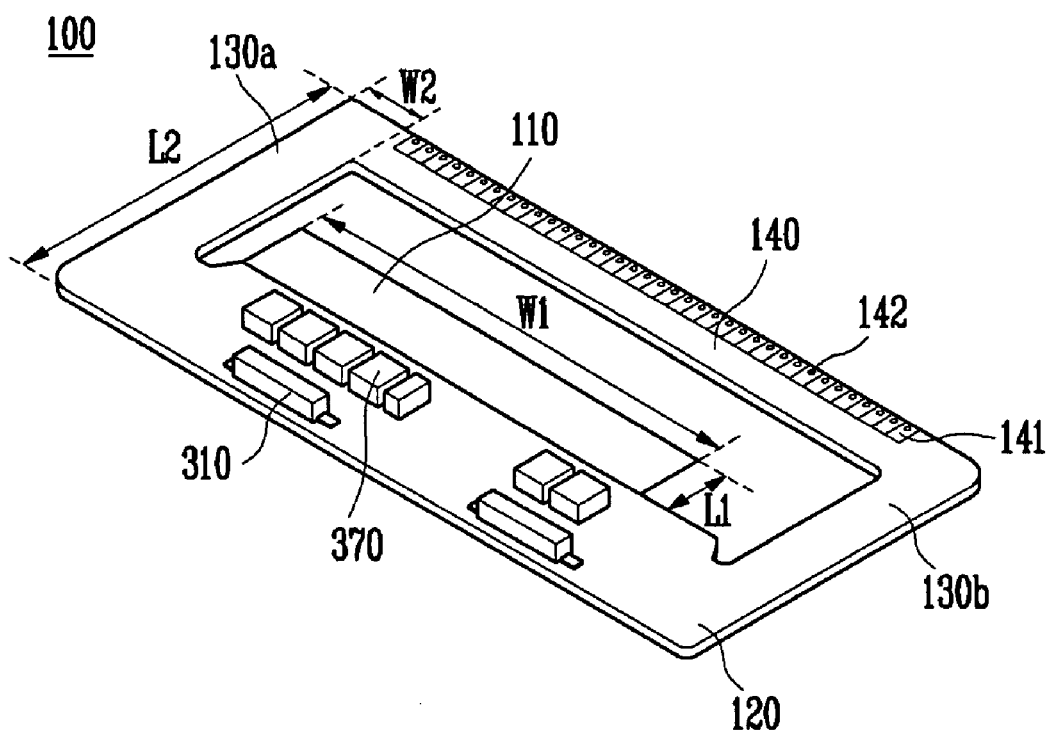
FIG. 1C illustrates a perspective view of a flexible printed circuit board according to another embodiment of the present invention.

The flexible printed circuit board 100 may include one or more connection substrate portions. FIG. 1C illustrates an embodiment where two connection substrate portions, i.e., a first connection substrate portion 130a and a second connection substrate portion 130b, may be provided. In one embodiment, the conductive wiring layer inside the flexible circuit board 100 may be split into two parts to pass through the connection substrate portions 130a, 130b.

The third substrate portion 140 may include at least one terminal 141 for attachment to another component of a liquid crystal display device. The terminal 141 may include the exposed conductive wiring layer of the flexible printed circuit board, and a hole 142 may penetrate each terminal.

The following provides an example of the flexible printed circuit board in a liquid crystal display device, according to an embodiment of the invention.

Figure 2:
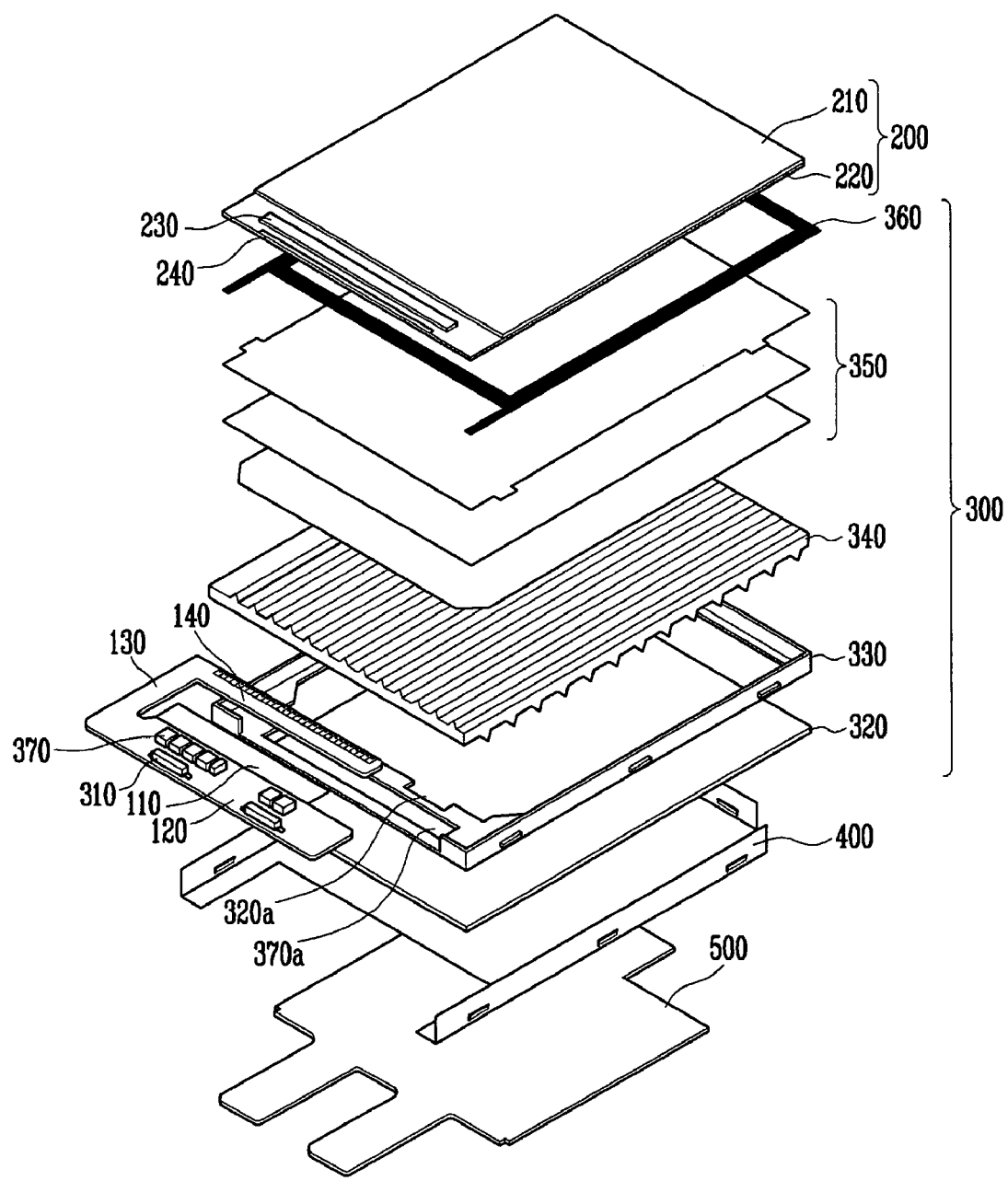
FIG. 2 illustrates an exploded perspective view of a liquid crystal display device according to an embodiment of the present invention.

FIG. 2 illustrates an exploded perspective view of a liquid crystal display device according to an exemplary embodiment of the present invention. The liquid crystal display device may include a liquid crystal display panel 200, a backlight unit 300, a driver printed circuit board 500 and a flexible printed circuit board 100. The liquid crystal display panel 200 may include a first substrate 210, a second substrate 220 and a liquid crystal (not shown) injected therebetween.

The second substrate 220 may include a plurality of thin film transistors (TFT) arranged in a matrix form, with an integrated circuit 230 mounted on one side of the second substrate 220 to supply data signals and scan signals. Also, the second substrate 220 may be formed with a pad portion 240 to receive the signals.

The first substrate 210 may be arranged to be opposite to the second substrate 220, and a common electrode configured of indium-tin-oxide (ITO) may be applied on the front surface of the first substrate 111. Upon the application of a predetermined voltage to the common electrode, a predetermined electrical field may be formed between the common electrode and a pixel electrode. Accordingly, an array angle of the liquid crystal injected between the first substrate 210 and the second substrate 220 may be changed by the electrical field. The light transmittance of the liquid crystal may change with the changed array angle to display a desired image. Polarizing plates 270a, 270b (see FIG. 3) may be provided on each external surface of the first substrate 210 and the second substrate 220.

The backlight unit 300 may receive light from one or more light-emitting diodes 310 to provide light in the lower part of the panel in order to illuminate an image. The backlight unit 300 may include a reflective sheet 320, a mold frame 330, a light guide plate 340, optical sheets 350, a rim frame 360 and a reflective plate 340.

The light emitting diodes 310, which may be mounted on the flexible printed circuit board 110, may generate light of a predetermined brightness in response to the driving signal transferred to the second substrate portion 120 of the flexible printed circuit board 100.

The light guide plate 340 may supply the light supplied from the light emitting diodes 310 to the liquid crystal display panel 200. In other words, the light guide plate 340 may direct the light to the liquid crystal display panel 200 positioned on the upper part thereof.

The reflective sheet 320 may be arranged on the rear surface of the light guide plate 340 to redirect any light from the light-emitting diodes 310 back to the light guide plate 340. The reflective sheet 320 may improve the efficiency of the lighting system. The optical sheets 350 may improve the brightness of the light from the light guide plate 340 to the liquid crystal display panel 200.

The mold frame 330 may include a groove 320a in which the light emitting diodes 310 on the second substrate 120 may be positioned.

The driver printed circuit board 500 may provide control signals to the display panel 200 and the backlight unit 300 through the flexible printed circuit board 100 in control signals.

A bezel 400 may be provided between the driver printed circuit board 500 and the backlight unit 300 to support the display panel 200. The bezel 400 may be made of metal.

The flexible printed circuit board 100 may transfer the electrical signals of the driver printed circuit board 500 to the light source 310 and the liquid crystal display panel 200. In other words, the flexible printed circuit board 100 may transfer electrical signals from an external source, via the driver printed circuit board 500, to the liquid crystal display panel 200 and to the light source 310.

Figure 3:
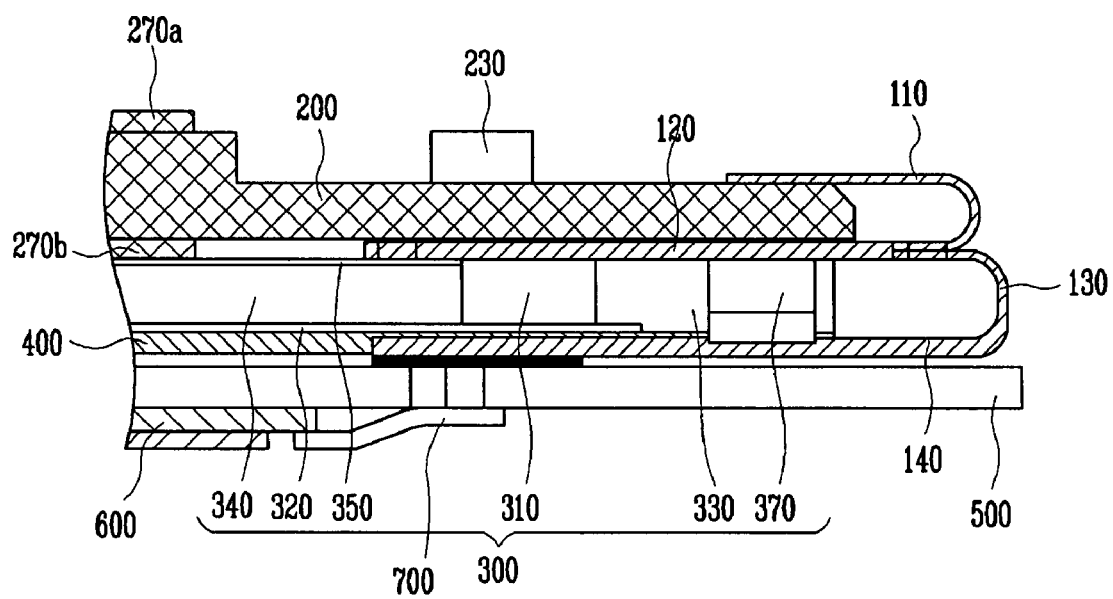
FIG. 3 illustrates a cross-sectional view of a liquid crystal display device according to an embodiment of the present invention.

FIG. 2 illustrates the flexible printed circuit board 100 in a planar, unfolded state. FIG. 3 illustrates a cross sectional view of a liquid crystal display device that incorporates the flexible printed circuit board 100, according to an exemplary embodiment of the present invention. Referring now to FIGS. 1A-1C and 3, the liquid crystal display device may include a flexible printed board circuit 100 connected to a liquid crystal display panel 200, a backlight unit 300, and a driver printed circuit board 500. As described above for FIGS. 1A-1C, the flexible printed circuit board 100 may include a first substrate portion 110, a second substrate portion 120, a connection substrate portion 130 and a third substrate portion 140.

The first substrate portion 110 may be connected to the liquid crystal display panel 200, and may include at least one terminal 111. The terminal 111 may be formed so as to contact a pad portion 240 of the liquid crystal display panel 20.

The first substrate portion 110 may be connected to part of the second substrate portion 120 and may be bent to place the liquid crystal display panel 200 beside the second substrate portion 120. The first substrate portion 110 may include a single layer of conductive wiring, and may be thinner than the second substrate portion 120 and the third substrate portion 140, which may include multiple layers of wiring. Thus, the first substrate portion 110 may be easily bent.

The second substrate portion 120 may be connected to the first substrate portion 110 at a bottom surface of a non-pixel region of the display panel 200. The second substrate portion 120 may provide a light source 310 positioned between the display panel 200 and the backlight unit 300. The light source 310 may be behind the display panel 200.

The backlight unit 300 may be provided on the bottom surface of the liquid crystal display panel 200. The backlight unit 300 may include a reflective sheet 320, a light guide plate 340, an optical sheet 350 and a rim frame (not shown) within a supporting mold frame 330, and behind the lower part of a pixel region of the display panel 200. Polarizing plates 270a, 270b may also be provided at the display panel 200. The mold frame 330 may include a groove 320a in which a light source 310 may be positioned. The light source 310 may be, e.g., an LED.

The second substrate portion 120 may include the light source 310 for illuminating the backlight unit 300. The light source 310 may be mounted downwardly on the second substrate portion 120 of the flexible printed circuit board 100 so that it may fit into a groove 320a on the mold frame 330, thereby serving as the light source for the backlight unit 300. In addition, the second substrate portion 120 may further include a boosting circuit 370, for boosting the voltage applied to the liquid crystal display panel 200 from the driver printed circuit board. The mold frame 330 may include a groove 370a in which the boosting circuit 370, or other components, may be positioned.

The connection substrate portion 130 may connect the second substrate portion 120 and the third substrate portion 140 and may permit them to bend relative to each other. The conductive wiring layer within the connection substrate 130 may be formed in one layer as in the first substrate portion 110. In this case, the connection substrate portion 130 may be formed to be thinner than the second substrate portion 120 and the third substrate portion 140.

The third substrate portion 140 may be connected to the driver printed circuit board 500 by at least one terminal 141, and may be positioned between the backlight unit 300 and the driver printed circuit board 500. The driver printed circuit board 500 and the terminal 141 of the flexible printed circuit board 100 may be connected by soldering.

FIGS. 4A-4D illustrate an assembly process for the flexible printed circuit board according to an exemplary embodiment of the present invention. The assembly process described is meant to explain how the flexible printed circuit board 100 may be connected and is not described to limit the assembly process of the actual liquid crystal display device.

Figure 4A:
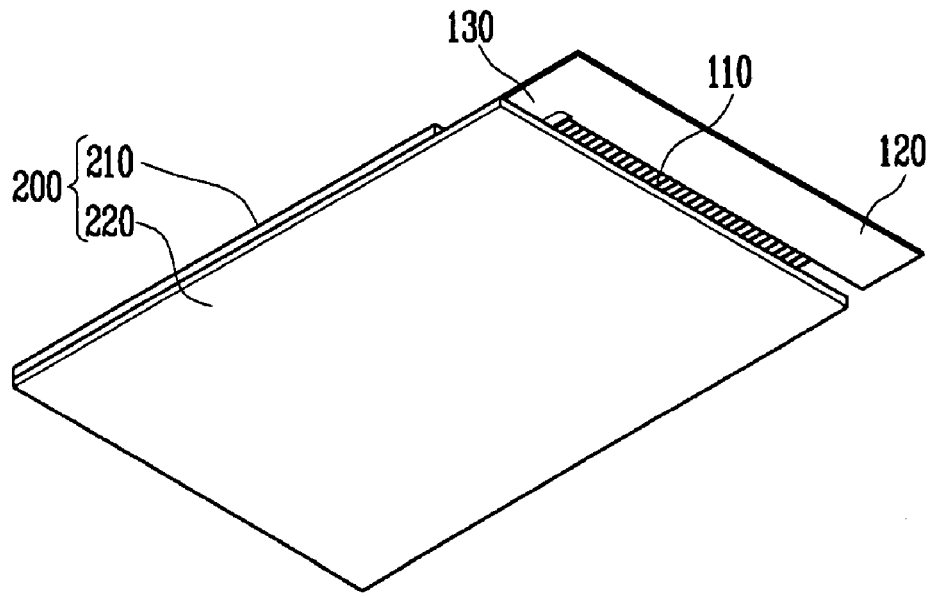
FIGS. 4A-4D illustrate perspective views of an assembling process to assemble the flexible printed circuit board according to an embodiment of the present invention on a liquid crystal display device.
Figure 4B:
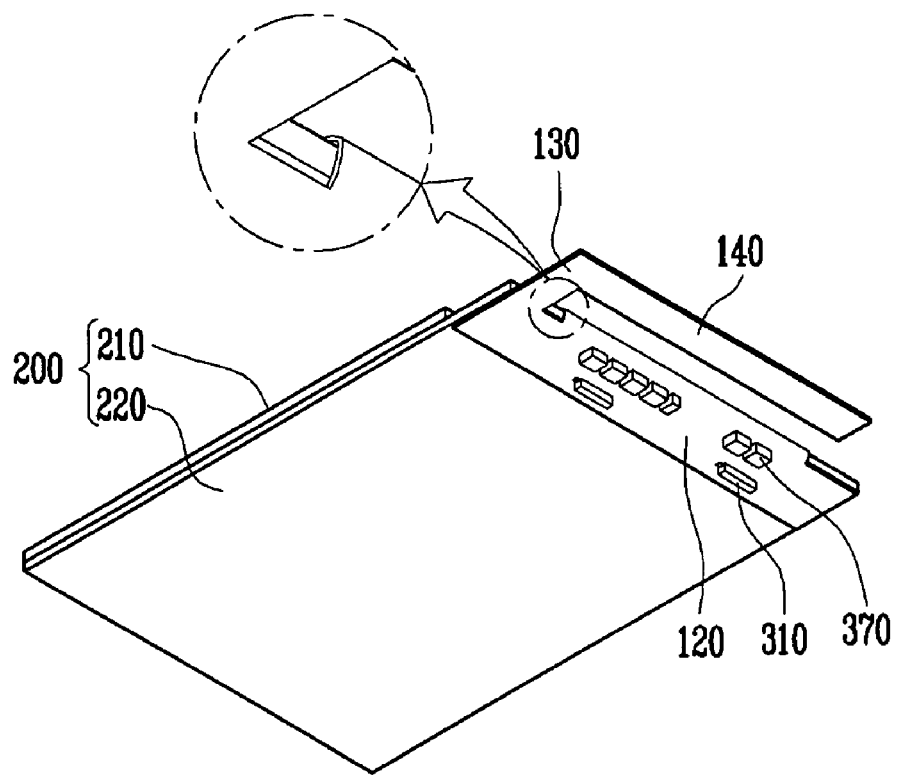

First, the terminal 111 of the first substrate portion 110 of the flexible printed circuit board 100 may be connected to the pad portion 240 of the liquid crystal display panel 200 (FIG. 4A). Next, the second substrate portion 120 may be positioned against the bottom surface of the liquid crystal display panel 200 by bending a portion of the first substrate portion 110 (FIG. 4B), which may be, e.g., a ground portion.

Figure 4C:
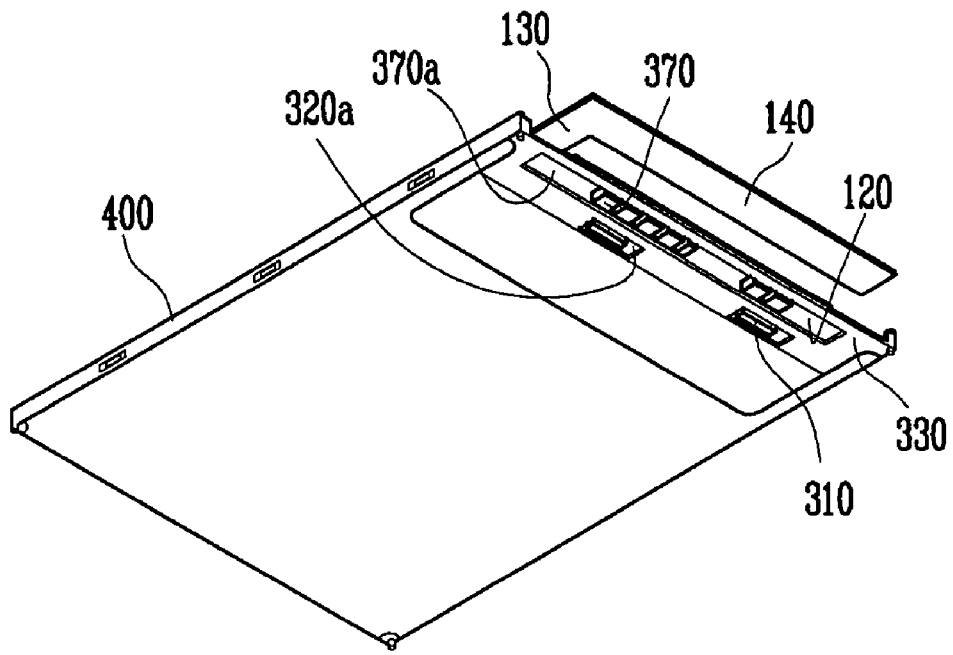

Next, the backlight unit 300 and the bezel 400 may be connected to the bottom surface of the liquid crystal display panel 200 to place the second substrate portion 120 therebetween. At this time, the light source 310 installed on the second substrate portion 120 may be positioned in the groove 320a formed on the mold frame 330 of the backlight unit 300, and the boosting circuit component 370 may also be positioned in the groove 370a (FIG. 4C).

Figure 4D:
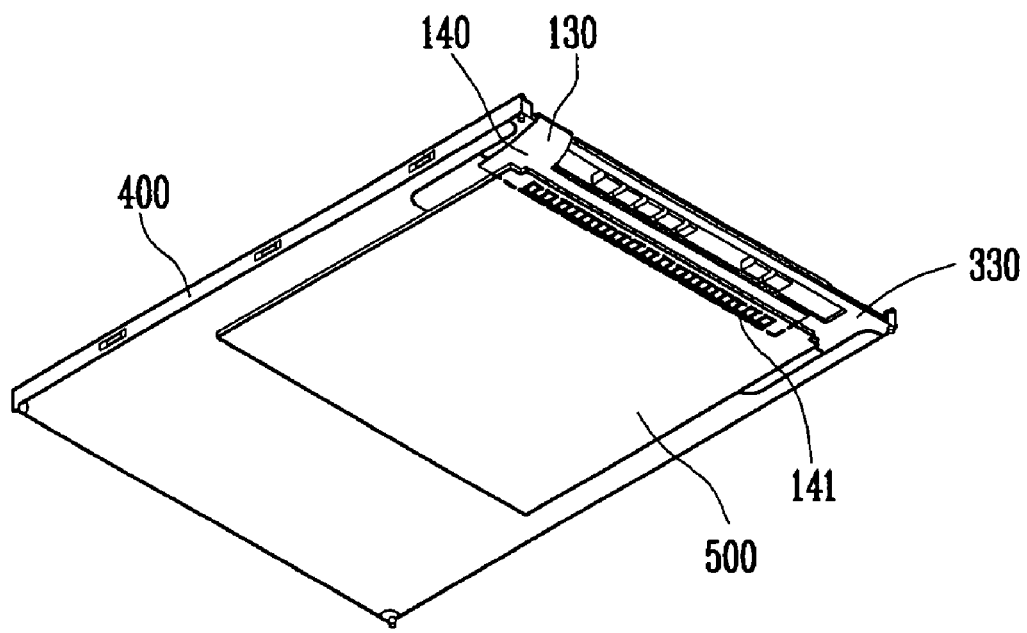

Next, the third substrate portion 140 and the driver printed circuit board 500 may be soldered together, and the connection substrate portion 130 may be bent so that the third substrate portion 140 and the driver printed circuit board 500 may be positioned against the bottom surface of the backlight unit 300 (FIG. 4D).

When the printed circuit board for driving 500 and the third substrate portion 140 are connected together, e.g., by soldering, any heat generated may not be transferred from the third substrate 140 to the second substrate portion 120 on which the light source 310 may be mounted, which may avoid deformation of the second substrate portion 120 due to heat. Therefore, the light source 310 on the second substrate portion 120 may be maintained in a predetermined position so that it may provide uniform brightness to the backlight unit 300.

Figure 5A:
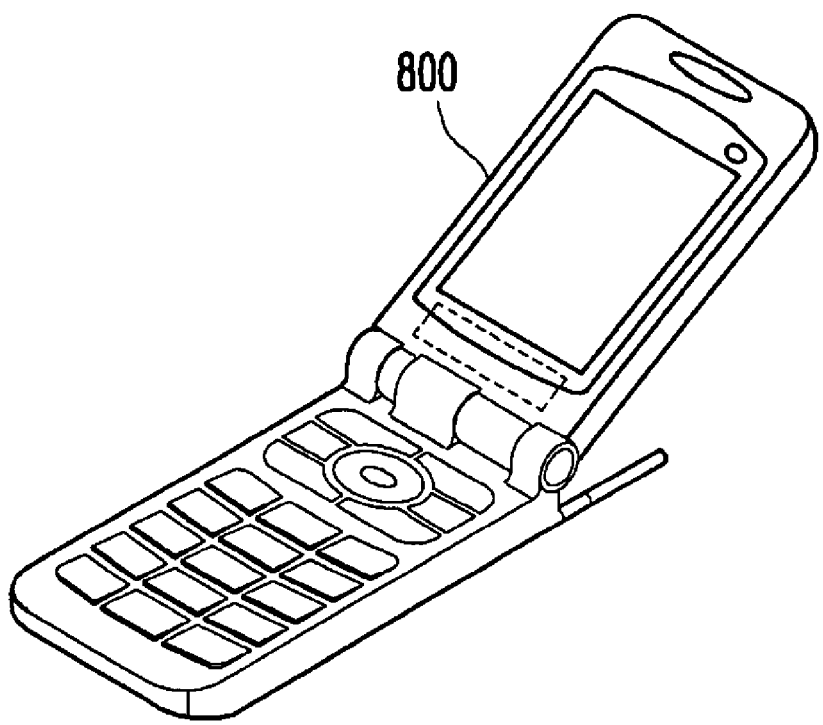
FIG. 5A illustrates a cellular phone including a liquid crystal display device according to the present invention.
Figure 5B:
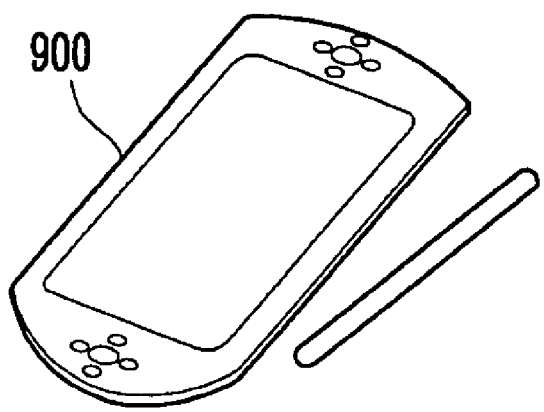
FIG. 5B illustrates a portable multimedia player including a liquid crystal display device according to the present invention.

FIGS. 5A-5B illustrate portable liquid crystal display apparatuses which may include a liquid crystal display device according to an exemplary embodiment of the present invention. The above-described liquid display device having a flexible printed circuit board may be included in a folding-type cellular phone 800 and a portable multimedia player 900, among other devices.

Exemplary embodiments of the present invention have been disclosed herein, and although specific terms are employed, they are used and are to be interpreted in a generic and descriptive sense only and not for purpose of limitation. For example, the change in the display panel structure of the liquid crystal display device, the change in the backlight unit structure, the change in the printed circuit board structure and the change in their coupling relationship, etc. can be made without departing from the scope of the invention. Accordingly, it will be understood by those of ordinary skill in the art that various changes in form and details may be made without departing from the spirit and scope of the present invention as set forth in the following claims.

What is claimed is:

1. A liquid crystal display device having a flexible printed circuit board to provide electrical signals from a driver printed circuit board to a liquid crystal display panel and a backlight unit, the flexible printed circuit board comprising:
    a first substrate portion connected to a pad portion of the liquid crystal display panel;
    a second substrate portion parallel to the first substrate portion, and connected to the first substrate portion and having a light source thereon;
    a third substrate portion parallel to the first substrate portion, positioned between the backlight unit and the driver printed circuit board1 and connected to the driver printed circuit board; and
    at least one connection substrate portion connecting the second substrate portion to the third substrate portion,
    wherein the first, second, third and connection substrate portions are integrated, the second substrate portion extends parallel to the liquid crystal display panel, and is layered between the first substrate portion and the third substrate portion, and the backlight unit is layered between the driver printed circuit board and the second substrate portion.

2. The liquid crystal display device as claimed in claim 1, wherein the backlight unit comprises:
    a light guide plate positioned on one side of the light source and receiving light from the light source; and
    a mold frame including a mounting groove,
    wherein the light source is positioned within the mounting groove in the mold frame.

3. The liquid crystal display device as claimed in claim 1, comprising at least two light sources on the flexible printed circuit board.

4. The liquid crystal display device as claimed in claim 1, wherein the light source is a light emitting diode.

5. The liquid crystal display device as claimed in claim 1, wherein the second substrate portion further comprises a boosting circuit for boosting voltage from the printed circuit board to the display panel.

6. The liquid crystal display device as claimed in claim 1, wherein the first substrate portion is thinner than the second substrate portion.

7. The liquid crystal display device as claimed in claim 6, wherein the first substrate portion includes a single layer of conductive wiring, and the second substrate portion includes two or more layers of conductive wiring.

8. The liquid crystal display device as claimed in claim 1, wherein the connection substrate portion is between the second substrate portion and the third substrate portion, is orthogonal to the second and third substrate portion, and is connected to a first end of the third substrate portion and a corresponding first end of the second substrate portion.

9. The liquid crystal display device as claimed in claim 8, wherein the connection substrate portion comprises:
    a first connection substrate portion connecting a first end of the second substrate portion to a first end of the third substrate portion; and
    a second connection substrate portion separate from the first connection substrate portion, the second connection substrate portion connecting a second end of the second substrate portion to a second end of the third substrate portion.

10. The liquid crystal display device as claimed in claim 1, wherein the connection substrate portion is thinner than the third substrate portion.

11. The liquid crystal display device as claimed in claim 10, wherein the connection substrate portion includes a single layer of conductive wiring, and the third substrate portion includes two or more layers of conductive wiring.

12. The liquid crystal display device as claimed in claim 1, wherein the light source is between the second substrate portion and the third substrate portion.

13. The liquid crystal display device as claimed in claim 1, wherein the light source is between the driver printed circuit board and the second substrate portion.

14. The liquid crystal display device as claimed in claim 1, wherein two or more light sources are between the driver printed circuit board and the second substrate portion.

15. The liquid crystal display device as claimed in claim 1, wherein a boosting circuit for boosting voltage from the driver printed circuit board to the display panel is between the driver printed circuit board and the second substrate portion.

16. The liquid crystal display device as claimed in claim 1, wherein the liquid crystal display panel and driver printed circuit board are layered with one atop the other and connected by the flexible printed circuit board.

17. The liquid crystal display device as claimed in claim 1, where the driver printed circuit board is attached to the third substrate of the flexible printed circuit board by a heat-oriented process.

18. The liquid crystal display device as claimed in claim 17, where the second substrate is isolated from the heat-oriented process.

* * * * *